US008889450B2

(12) United States Patent
Son

(10) Patent No.: US 8,889,450 B2
(45) Date of Patent: Nov. 18, 2014

(54) LIGHT EMITTING DIODE AND METHOD FOR FABRICATING THE SAME

(71) Applicant: LG Display Co., Ltd., Seoul (KR)

(72) Inventor: Su-Hyoung Son, Hwaseong-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 14/219,761

(22) Filed: Mar. 19, 2014

(65) Prior Publication Data

US 2014/0206120 A1   Jul. 24, 2014

Related U.S. Application Data

(62) Division of application No. 13/306,091, filed on Nov. 29, 2011, now Pat. No. 8,716,692.

(30) Foreign Application Priority Data

Nov. 30, 2010  (KR) .................. 10-2010-0120848

(51) Int. Cl.
*H01L 21/66* (2006.01)
*H01L 33/06* (2010.01)

(52) U.S. Cl.
CPC ........................... *H01L 33/06* (2013.01)
USPC  438/46; 257/99; 257/E33.062; 257/E33.008; 257/E21.527

(58) Field of Classification Search
USPC ............. 257/99, E33.062, E33.008, E21.527; 438/46
See application file for complete search history.

(56) References Cited

U.S. PATENT DOCUMENTS

| 2005/0179130 A1 | 8/2005 | Tanaka et al. |
| 2008/0197378 A1 | 8/2008 | Kong et al. |

FOREIGN PATENT DOCUMENTS

| CN | 101558502   | 10/2009 |
| CN | 101689593 A | 3/2010 |
| CN | 101771124 A | 7/2010 |
| DE | 19807758 A1 | 12/1998 |
| DE | 102006015788 A1 | 9/2007 |
| DE | 102008009642 A1 | 8/2008 |
| GB | 2326023 A | 12/1998 |
| JP | 11-312825 A | 11/1999 |
| JP | 2004511080 A | 4/2004 |
| KR | 1020050092947 | 9/2005 |
| KR | 1020080006207 | 1/2008 |
| KR | 1020090073946 | 7/2009 |
| WO | WO 2005/088741 A1 | 9/2005 |
| WO | WO 2007/085218 A1 | 8/2007 |
| WO | WO 2009/096647 A1 | 8/2009 |

OTHER PUBLICATIONS

Office Action issued in corresponding Korean Patent Application No. 10-2010-0120848, mailed Oct. 5, 2012.
Office Action issued in corresponding German Patent Application No. 102011055715.6, mailed Mar. 28, 2013.
Office Action issued in corresponding Chinese Patent Application No. 201110380770.X, mailed Nov. 19, 2013, 19 pages.

*Primary Examiner* — Elias M Ullah
(74) *Attorney, Agent, or Firm* — Brinks Gilson & Lione

(57) ABSTRACT

The disclosed light emitting diode includes a substrate provided, at a surface thereof, with protrusions, a buffer layer formed over the entirety of the surface of the substrate, a first semiconductor layer formed over the buffer layer, an active layer formed on a portion of the first semiconductor layer, a second semiconductor layer formed over the active layer, a first electrode pad formed on another portion of the first semiconductor layer, except for the portion where the active layer is formed, and a second electrode pad formed on the second semiconductor layer. Each protrusion has a side surface inclined from the surface of the substrate at a first angle, and another side surface inclined from the surface of the substrate at a second angle different from the first angle.

12 Claims, 13 Drawing Sheets

| Conventional | Efficacy (W) | Output (W/sr) |
|---|---|---|
| Conventional | 0.86233 | 0.16424 |
| Present invention | 0.88738 | 0.27732 |
| Comparison | Increase of about 3% | Increase of 68.9% |

LIGHT EMITTING DIODE AND METHOD FOR FABRICATING THE SAME

The present patent document is a divisional of U.S. patent application Ser. No. 13/306,091 filed on Nov. 29, 2011, which claims priority to Korean Patent Application Nos. 10-2010-0120848 filed Nov. 30, 2010, the entire contents of which is incorporated herein by reference for all purposes as if fully set forth herein.

BACKGROUND

1. Field of the Invention

The present disclosure relates to a light emitting diode, and more particularly, to a light emitting diode capable of achieving an enhancement in luminous efficacy and a method for fabricating the same.

2. Discussion of the Related Art

Generally, a light emitting diode (LED) is a device, which emits light when current is applied thereto. Such an LED converts electricity into light, using the characteristics of a compound semiconductor. The LED is known to exhibit excellent energy saving effects through high luminosity at low voltage. Recently, brightness problems involved in LEDs have been greatly reduced. As a result, LEDs are being applied to various appliances such as backlight units of liquid crystal display devices, advertising display panels, indicators, home electronic appliances, etc.

In particular, GaN-based LEDs are highlighted as a next-generation light source in that they may be used for various purposes because they generate infrared light or wide light emitting spectrums including infrared light, and they do not include environmentally-harmful substances such as arsenic (As) and mercury (Hg).

FIG. 1A is a perspective view illustrating a general LED. FIG. 1B is a cross-sectional view taken along a line A-A' in FIG. 1A. FIG. 2 is a sectional view illustrating total reflection occurring within a general LED.

As shown in FIGS. 1A and 1B, the general LED includes a substrate 100, a buffer layer 110 formed over the substrate 100, a first semiconductor layer 130 formed over the buffer layer 110, an active layer 140 formed on a portion of the first semiconductor layer 130, and a second semiconductor layer 150 formed over the active layer 140. The LED also includes an ohmic contact layer 160 formed on the second semiconductor layer 150, using a transparent conductive material, a first electrode pad 180 formed at another portion of the first semiconductor layer 130 where the active layer 140 is not formed, and a second electrode pad 170 formed on the ohmic contact layer 160.

When a part of light generated from the active layer 140 is incident upon another layer having a certain index of refraction at an angle of incidence not less than a critical angle, in the above-mentioned general LED, the incident light is totally reflected in the layer, such that it is confined within the device.

For example, when light is incident upon the substrate 100 at an incidence angle not less than a critical angle, it is totally reflected in the substrate 100, so that it may not pass through boundary surfaces of the substrate 100. As a result, the light may be confined within the device. The light confined within the device vanishes after being repeatedly reflected between layers. Consequently, a reduction in luminous efficacy occurs.

BRIEF SUMMARY

A light emitting diode includes a substrate provided, at a surface thereof, with protrusions, a buffer layer formed over the entirety of the surface of the substrate, a first semiconductor layer formed over the buffer layer, an active layer formed on a portion of the first semiconductor layer, a second semiconductor layer formed over the active layer, a first electrode pad formed on another portion of the first semiconductor layer, except for the portion where the active layer is formed, and a second electrode pad formed on the second semiconductor layer, wherein each of the protrusions has a side surface inclined from the surface of the substrate at a first angle, and another side surface inclined from the surface of the substrate at a second angle different from the first angle.

In another aspect, a method for fabricating a light emitting diode includes etching a surface of a substrate, to form a plurality of protrusions, etching the protrusions such that each of the protrusions has a side surface inclined from the surface of the substrate at a first angle, and another side surface inclined from the surface of the substrate at a second angle different from the first angle, forming a plurality of nitride semiconductor layers over the protrusion-formed substrate, and forming electrode pads on at least one of the plural nitride semiconductor layers.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and along with the description serve to explain the principle of the invention. In the drawings.

DETAILED DESCRIPTION OF THE DRAWINGS AND THE PRESENTLY PREFERRED EMBODIMENTS

Reference will now be made in detail to the preferred embodiments of the present invention, examples of which are illustrated in the accompanying drawings. Wherever possible, the same reference numbers will be used throughout the drawings to refer to the same or like parts.

First Embodiment

Figure 1A:
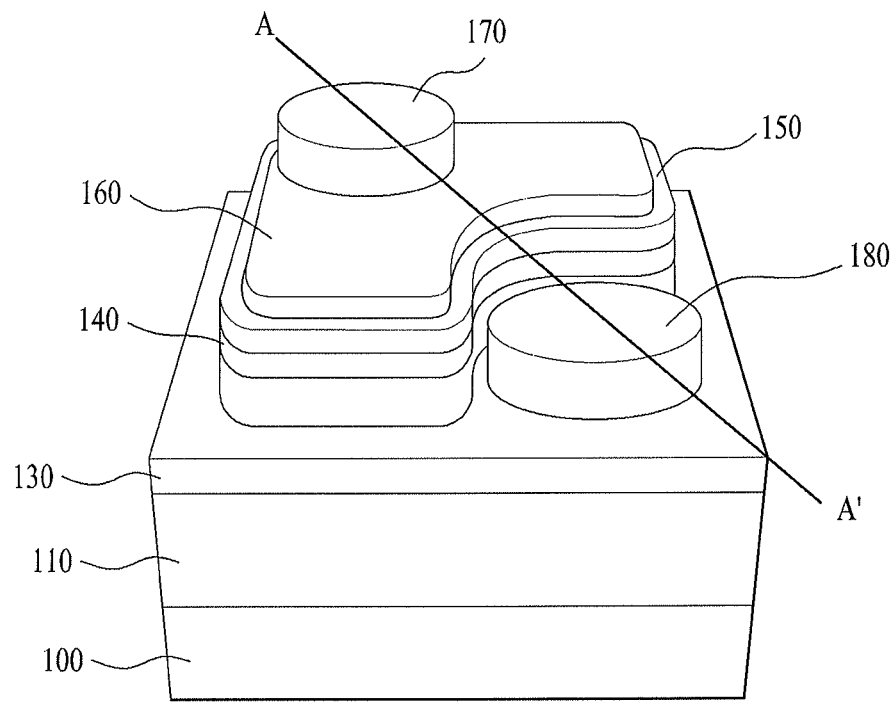
FIG. 1A is a perspective view illustrating a general light emitting diode (LED)
Figure 1B:
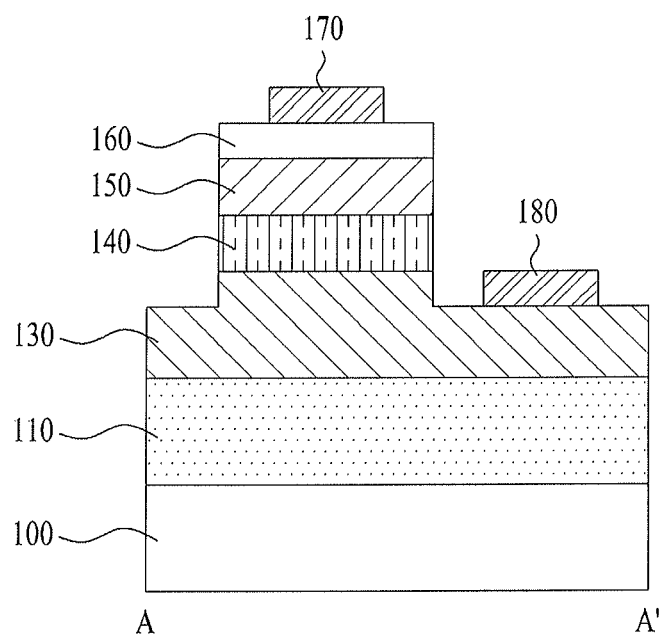
FIG. 1B is a cross-sectional view taken along a line A-A' in FIG. 1A.
Figure 2:
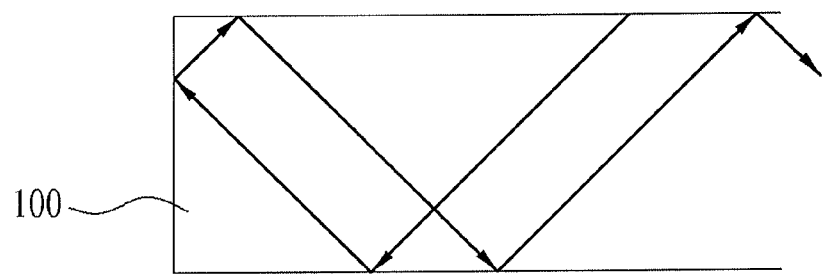
FIG. 2 is a sectional view illustrating total reflection occurring within a general LED.
Figure 3:
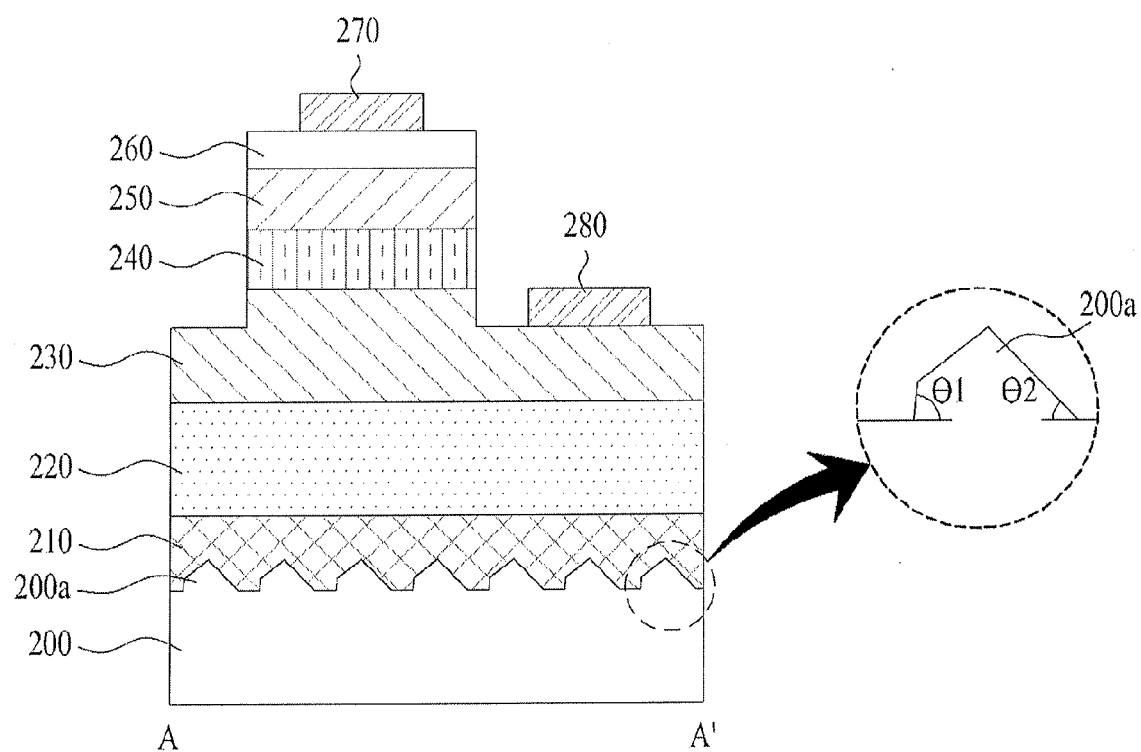
FIG. 3 is a sectional view illustrating an LED according to a first embodiment of the present invention.
Figure 4:
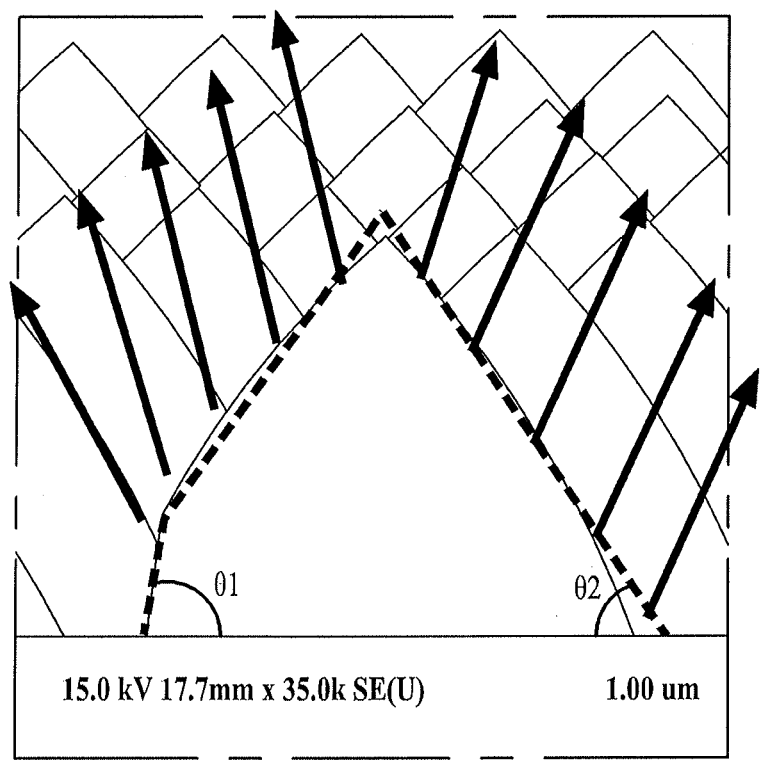
FIG. 4 is a sectional view illustrating reflection of light from a substrate and protrusions shown in FIG. 3.
Figure 5A:
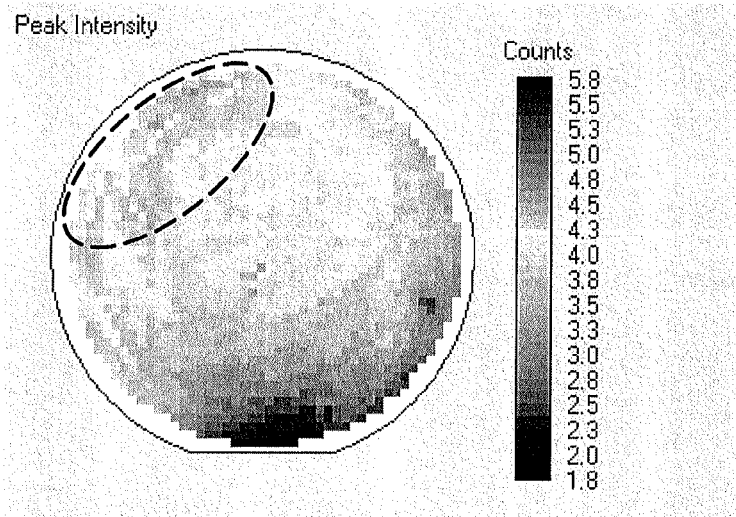
FIG. 5A is a diagram depicting data obtained after measuring luminous efficacy in regions of the substrate where protrusions are distributed.
Figure 5B:
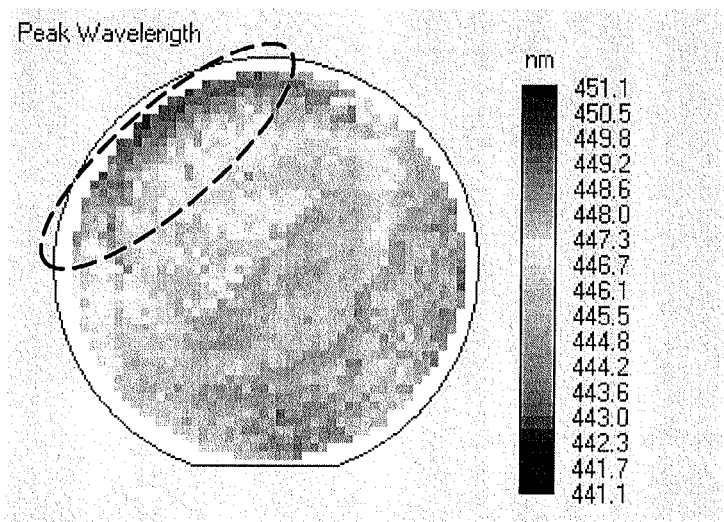
FIG. 5B is a diagram depicting data obtained after measuring a wavelength of light in the regions of the substrate where protrusions are distributed, respectively.

FIG. 3 is a sectional view illustrating a light emitting diode (LED) according to a first embodiment of the present invention. FIG. 4 is a sectional view illustrating reflection of light from a substrate and protrusions shown in FIG. 3. FIGS. 5A and 5B are diagrams depicting data obtained after measuring luminous efficacy in regions of the substrate where the protrusions are distributed and data obtained after measuring a wavelength of light in the regions of the substrate where the protrusions are distributed, respectively.

As shown in FIG. 3, the LED according to the first embodiment of the present invention includes a substrate 200 provided, at a surface thereof, with protrusions 200a, first and second buffer layers 210 and 220 sequentially formed over an entire upper surface of the substrate 200, a first semiconductor layer 230 formed over the second buffer layer 220, an active layer 240 formed on a portion of the first semiconductor layer 230, and a second semiconductor layer 250 formed over the active layer 240. The LED also includes an ohmic contact layer 260 formed over the second semiconductor layer 250, a first electrode pad 280 formed on a portion of the first semiconductor layer 230, except for the portion where the active layer 240 is formed, and a second electrode pad 270 formed over the ohmic contact layer 260.

Each protrusion 200a has a side surface inclined from the surface of the substrate 200 at an acute angle, namely, a first angle $\theta 1$, and another side surface inclined from the surface of the substrate 200 at an acute angle different from the first angle $\theta 1$, namely, a second angle $\theta 2$.

The substrate 200 is made of a transparent insulating material such as sapphire ($Al_2O_3$), aluminum nitride (AlN), gallium nitride (GaN), or silicon carbide (SiC). In particular, the substrate 200 may be made of sapphire. The sapphire substrate is a crystal body having Hexa-Rhombo R3c symmetry. The sapphire substrate has a lattice constant of 13.001 Å in c-axis orientation and a lattice constant of 4.765 Å in a-axis orientation while having a C-plane (0001), an A-plane (1120) and an R-plane (1102). The C-plane of the sapphire substrate allows a nitride film to be relatively easily grown thereover, and is stable even at high temperatures.

As mentioned above, in a general LED, there may be a problem in that, when light is incident upon a substrate at an incidence angle not less than a critical angle, it is totally reflected in the substrate, so that it may not pass through boundary surfaces of the substrate, thus being confined within the device. The light contained within the device vanishes after being repeatedly reflected between layers. Consequently, a reduction in luminous efficacy occurs.

To this end, the LED according to the illustrated embodiment of the present invention is provided with a plurality of protrusions 200a formed on the surface of the substrate 200 in order to achieve an enhancement in the light emission efficiency of the device. Although the protrusions 200a are regularly distributed while having the same shape, they may be irregularly distributed. Also, adjacent ones of the protrusions 200a may be joined at one point or one surface.

The protrusions 200a upwardly reflect light traveling toward the substrate 200 after being generated from the active layer 240 so that the reflected light is outwardly emitted. The protrusions 200a also emit light incident upon the substrate 200 at an incidence angle not less than the critical angle, outwardly of the device, in order to prevent the incident light from being confined within the substrate 200.

In particular, the protrusions 200a may have a cross-section having a polygonal shape such as a triangular shape or a square shape. Since the first angle $\theta 1$, at which one surface of each protrusion 200a is acutely inclined from the surface of the substrate 200, is different from the second angle $\theta 2$, at which another surface of the protrusion 200a is acutely inclined from the surface of the substrate 200, the light emitted through the protrusion 200a is condensed toward one side, as shown in FIG. 4.

The surfaces of the protrusion 200a respectively inclined at the first and second angles $\theta 1$ and $\theta 2$ with respect to the surface of the substrate 200 are side surfaces most adjacent to the substrate 200. The first and second angles $\theta 1$ and $\theta 2$ range from about 45° to about 90°. Also, the first angle $\theta 1$ is greater than the second angle $\theta 2$.

Referring to FIGS. 5A and 5B, it may be seen that the substrate exhibits maximum luminous efficacy at a portion thereof where the protrusions are distributed, and light exhibits a wavelength nearest to 450 nm at the portion of the substrate where the protrusions are distributed. Thus, in accordance with the illustrated embodiment of the present invention, it may be possible to achieve an enhancement in light extraction efficiency because light incident upon the substrate 200 after being generated in the active layer 240 is outwardly emitted after being condensed toward one side by the protrusions 200a.

Again referring to FIG. 3, the first buffer layer 210 is formed to enable appropriate growth of layers made of a nitride semiconductor over the substrate 200, namely, the second buffer layer 220, first semiconductor layer 230, active layer 240, and second semiconductor layer 250. The first buffer layer 210 is interposed between the substrate 200 and the second buffer layer 220. The first buffer layer 2310 is made of a material having similar characteristics to a nitride semiconductor, for example, silicon dioxide ($SiO_2$).

The second buffer layer 220 is provided between the substrate 200 and the first semiconductor layer 230 in order to eliminate adverse affects caused by different lattice constants and different coefficients of thermal expansion of the substrate 200 and the first semiconductor layer 230 made of an n-type nitride semiconductor (n-GaN). In particular, it may be possible to enhance the crystallinity of the n-type nitride semiconductor, using a method in which the second buffer layer 220 is formed through growth of an undoped nitride semiconductor, and an n-type nitride semiconductor is then grown over the second buffer layer 220.

The first semiconductor layer 230 is made of an n-type nitride semiconductor (n-GaN), which has conductivity through addition of an impurity such as Si, Ge, Se, Te, or C. AlGaN and GaInN are representative n-type nitride semiconductors.

The active layer 240 is a layer in which light is generated in accordance with recombination of electrons and holes. The active layer 240 has a multi-quantum well (MQW) structure including barrier and well layers (InGaN—GaN), to emit light in a wavelength band of 350 to 550 nm. The wavelength band of light to be emitted by the LED is determined in accordance with the composition of the nitride semiconductor (InGaN and GaN). The second semiconductor layer 250 is made of a p-type nitride semiconductor (p-GaN) having conductivity through addition of an impurity such as Mg, Zn or Be. AlGaN and GaInN are representative p-type nitride semiconductors.

The ohmic contact layer 260 contacts the second semiconductor layer 250, which is made of a p-type nitride semiconductor (p-GaN). The ohmic contact layer 260 is made of a transparent conductive material such as ZnO or indium tin oxide (ITO). The ohmic contact layer 260 achieves an enhancement in current efficiency and easy outward emission of light generated in the active layer 240 because current may be widely dispersed in the second semiconductor layer 250 by the ohmic contact layer 260.

The first electrode pad 280 is made of a metal selected from Ni, Au, Pt, Ti, Al, and alloys thereof. The first electrode pad 280 is formed to contact a portion of the first semiconductor layer 230 exposed in accordance with partial removal of the ohmic contact layer 260, second semiconductor layer 250, and active layer 240. The second electrode pad 270 is made of a metal selected from Ni, Au, Pt, Ti, Al, and alloys thereof. The second electrode pad 270 is formed to contact a portion of the ohmic contact layer 260.

In the LED according to the first embodiment of the present invention, an enhancement in light extraction efficiency is achieved even when light emitted from the active layer 240 is incident upon the substrate 200 at an incidence angle not less than a critical angle, because the light is outwardly emitted after being condensed toward one side through the protrusions 200a. Meanwhile, although not shown, the protrusions 200a may also be formed on the surfaces of the first buffer layer 210, second buffer layer 220, first semiconductor layer 230, and second semiconductor layer 250.

Hereinafter, a method for fabricating the LED according to the first embodiment of the present invention will be described in detail with reference to the accompanying drawings.

Figure 6:
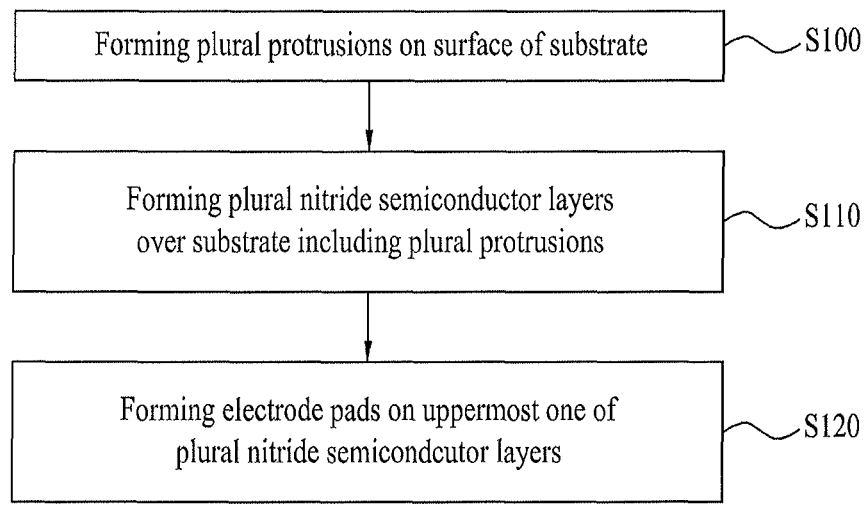
FIG. 6 is a flowchart illustrating a method for fabricating the LED according to the first embodiment of the present invention.

FIG. 6 is a flowchart illustrating a method for fabricating the LED according to the first embodiment of the present invention. FIGS. 7A to 7E are sectional views illustrating sequential processes of the LED fabrication method shown in FIG. 6, respectively.

As shown in FIG. 6, the method for fabricating the LED according to the first embodiment of the present invention includes a process of forming a plurality of protrusions on a surface of the substrate (S100), a process of forming a plurality of nitride semiconductor layers over the protrusion-formed surface of the substrate (S110), and a process of forming electrode pads on an uppermost one of the nitride semiconductor layers (S120).

The process S100 of forming a plurality of protrusions on the surface of the substrate includes forming protrusions on the surface of the substrate, and etching the protrusions such that each protrusion has a side surface inclined from the surface of the substrate at a first angle θ1, and another side surface inclined from the surface of the substrate at a second angle θ2 different from the first angle θ1.

In the process of forming the protrusions on the surface of the substrate, a mask is first formed on the surface of the substrate, using a photolithography method, a lift-off method or a nano implantation method. Thereafter, the surface of the substrate is etched, using the mask. Etching is carried out using a dry etching method in which HBr or a Cl-based etching gas such as $Cl_2$, $BCl_3$, HCl, $CCl_4$ or $SiCl_4$ is used.

In the photolithography method, a polymer, $SiO_X$, $Si_XN_Y$, or a metal is deposited over the substrate, and a photoresist is then coated thereon. The photoresist is subjected to exposure and development processes, to pattern the polymer, $SiO_X$, $Si_XN_Y$, or metal formed over the substrate. Thereafter, the substrate is etched using the patterned polymer, $SiO_X$, $Si_XN_Y$, or metal as a mask, to form the protrusions.

In the lift-off method, a photoresist is first coated over the substrate. The photoresist is then patterned. Thereafter, a polymer, $SiO_X$, $Si_XN_Y$, or a metal is deposited over the substrate, from which the photoresist is then removed. Using the remaining polymer, $SiO_X$, $Si_XN_Y$, or metal as a mask, the substrate is etched to form the protrusions.

In the nano implantation method, a photoresist is first coated over the substrate. The photoresist is then pressed by a mold, to be patterned. Using the patterned photoresist as a mask, the surface of the substrate is etched, to form the protrusions.

Figure 7A:
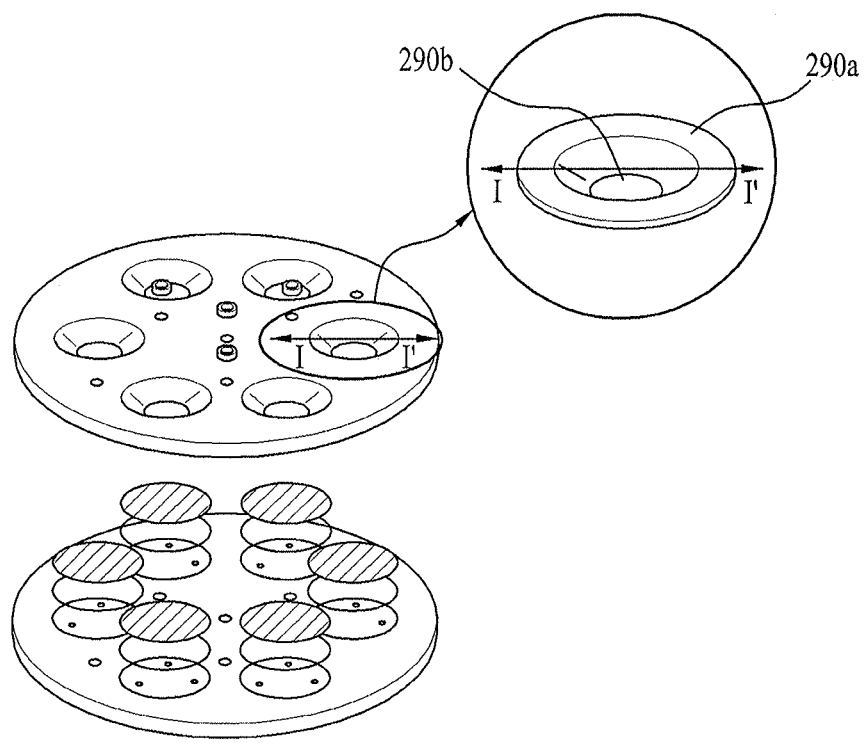
FIGS. 7A to 7E are sectional views illustrating sequential processes of the LED fabrication method shown in FIG. 6, respectively.

Referring to FIG. 7A, the process of etching each protrusion is carried out in accordance with a dry etching method in which a mask 290a having an open region 290b at a central portion thereof, and an inclined surface formed between the central portion and a peripheral portion surrounding the central portion.

Figure 7B:
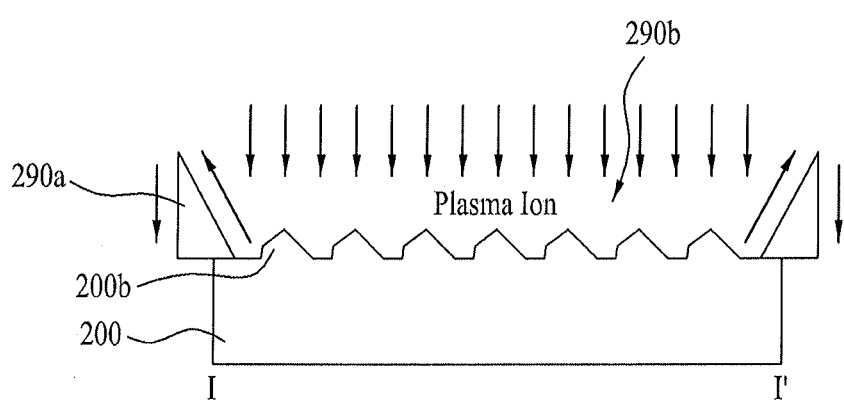

Referring to FIG. 7B, a turbulent flow of the HBr or Cl-based etching gas is formed at the open region 290b of the mask 290a. The protrusion 200a is etched by the etching gas such that it has a shape inclined toward one side.

Figure 7C:
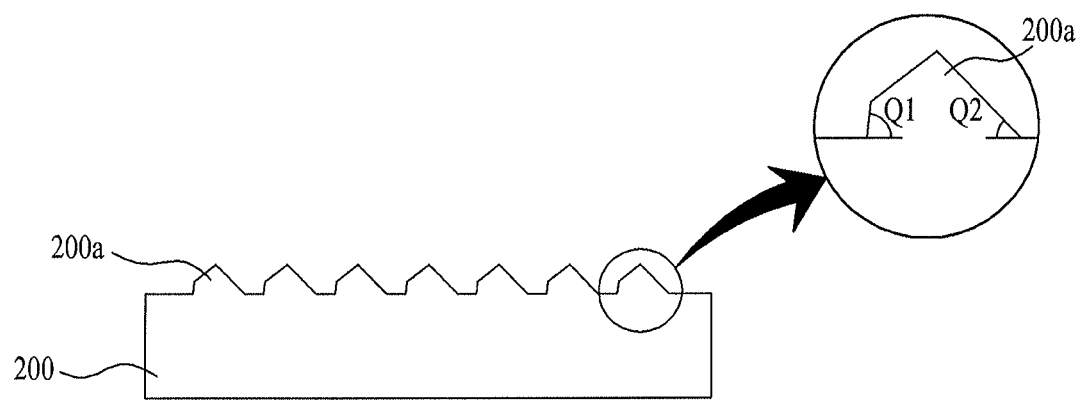

As a result, as shown in FIG. 7C, the protrusion 200a has a side surface inclined from the surface of the substrate 200 at an acute angle, namely, a first angle θ1, and another side surface inclined from the surface of the substrate 200 at an acute angle different from the first angle θ1, namely, a second angle θ2. In this case, the surfaces of the protrusion 200a respectively inclined at the first and second angles θ1 and θ2 with respect to the surface of the substrate 200 are side surfaces most adjacent to the substrate 200. In order to remove by-products after the above-described dry etching process, a wet etching process using HF, HI, $H_2SO_4$, $HNO_3$, or $H_3PO_4$ may be further carried out.

Figure 7D:
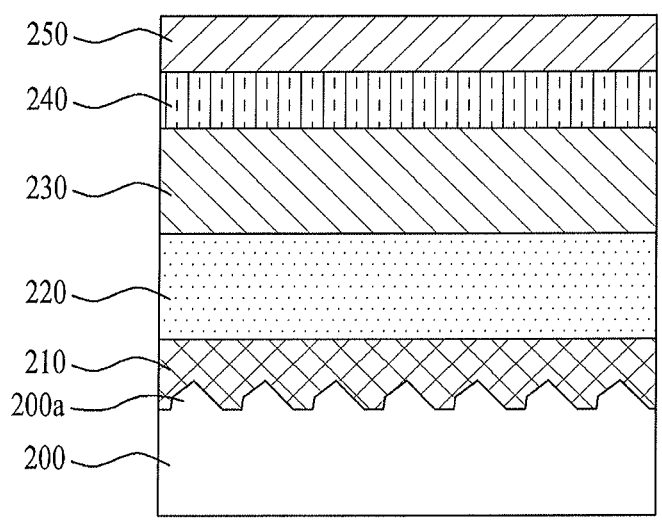

Referring to FIG. 7D, in the process S110 of forming a plurality of nitride semiconductor layers over the substrate including the plurality of protrusions, the first buffer layer 210, second buffer layer 220, first semiconductor layer 230, active layer 240, and second semiconductor layer 250 are sequentially formed.

The plural nitride semiconductor layers, namely, the second buffer layer 220, first semiconductor layer 230, active layer 240, and second semiconductor layer 250, may be formed using metal organic chemical vapor deposition (MOCVD), liquid phase epitaxy, hydride vapor phase epitaxy, or molecular beam epitaxy. In particular, the plural nitride semiconductor layers may be formed using MOCVD.

For example, the second buffer layer 220 may be formed of an undoped nitride semiconductor layer (for example, an undoped GaN layer). The first semiconductor layer 230 may be formed of an n-type nitride semiconductor layer doped with Si (for example, an n-GaN layer), The active layer 240 may be formed of a nitride semiconductor layer having an MQW structure including, for example, five layers, (for example, an InGaN—GaN layer). The second semiconductor layer 250 may be formed of a p-type nitride semiconductor layer doped with Mg (for example, p-GaN).

The process S120 of forming electrode pads includes forming an ohmic contact layer, using a transparent conductive material, forming a second electrode pad to contact a portion of the ohmic contact layer, removing portions of the ohmic contact layer, second semiconductor layer, and active layer, to expose a portion of the first semiconductor layer, and forming a first electrode pad on the exposed portion of the first semiconductor layer.

Figure 7E:
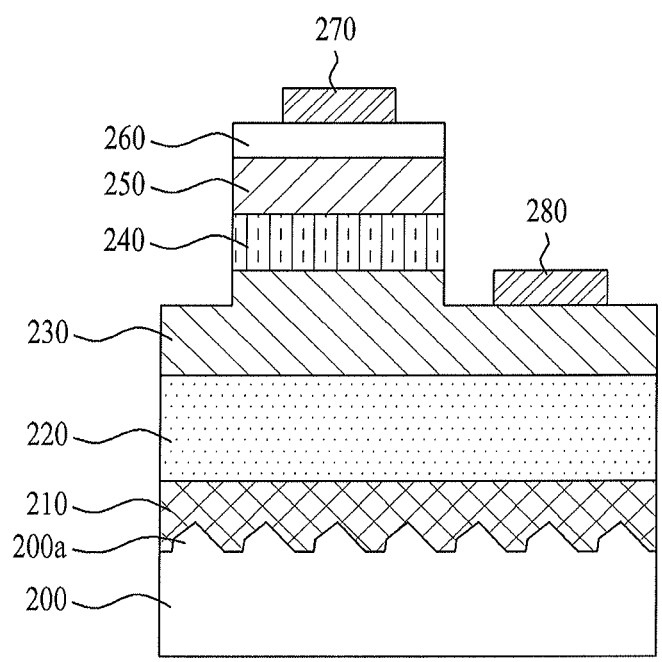

Referring to FIG. 7E, the ohmic contact layer 260 is formed on the second semiconductor layer 250, using a transparent conductive material such as ZnO or ITO. The second semiconductor layer 250 and active layer 240 are partially removed to expose a portion of the first semiconductor layer 230. Thereafter, the first electrode pad 280 is formed using a metal selected from Ni, Au, Pt, Ti, Al, and alloys thereof, to contact the exposed portion of the first semiconductor layer 130.

Also, the second electrode pad 270 is formed using a metal selected from Ni, Au, Pt, Ti, Al, and alloys thereof, to contact a portion of the ohmic contact layer 260.

In the LED formed in accordance with the above-described method, an enhancement in light extraction efficiency is achieved because light passing through the protrusions 200a is outwardly emitted after being condensed toward one side.

Second Embodiment

Figure 8:
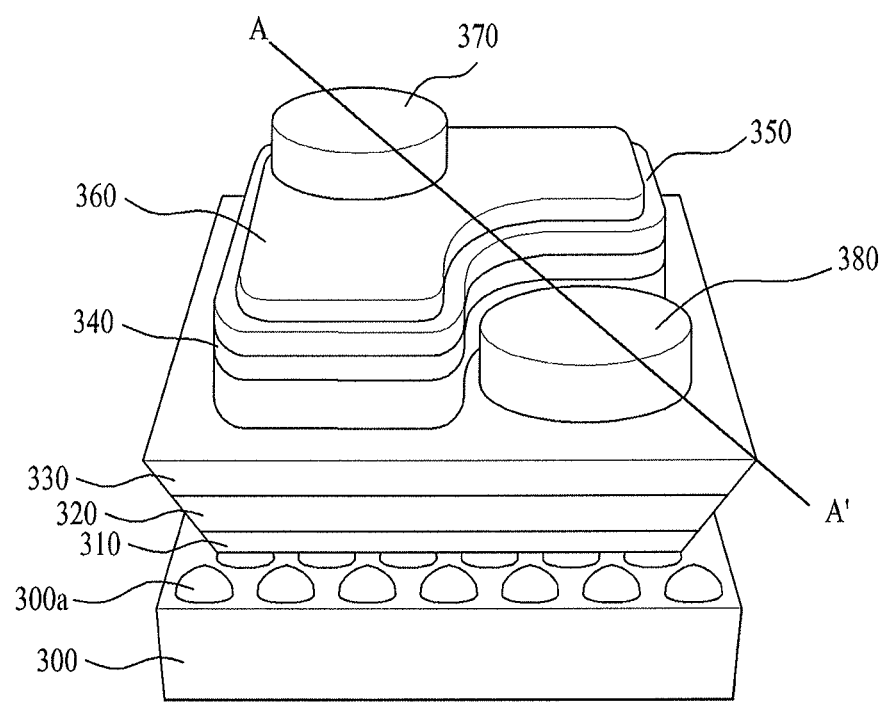
FIG. 8 is a perspective view illustrating an LED according to a second embodiment of the present invention.
Figure 9:
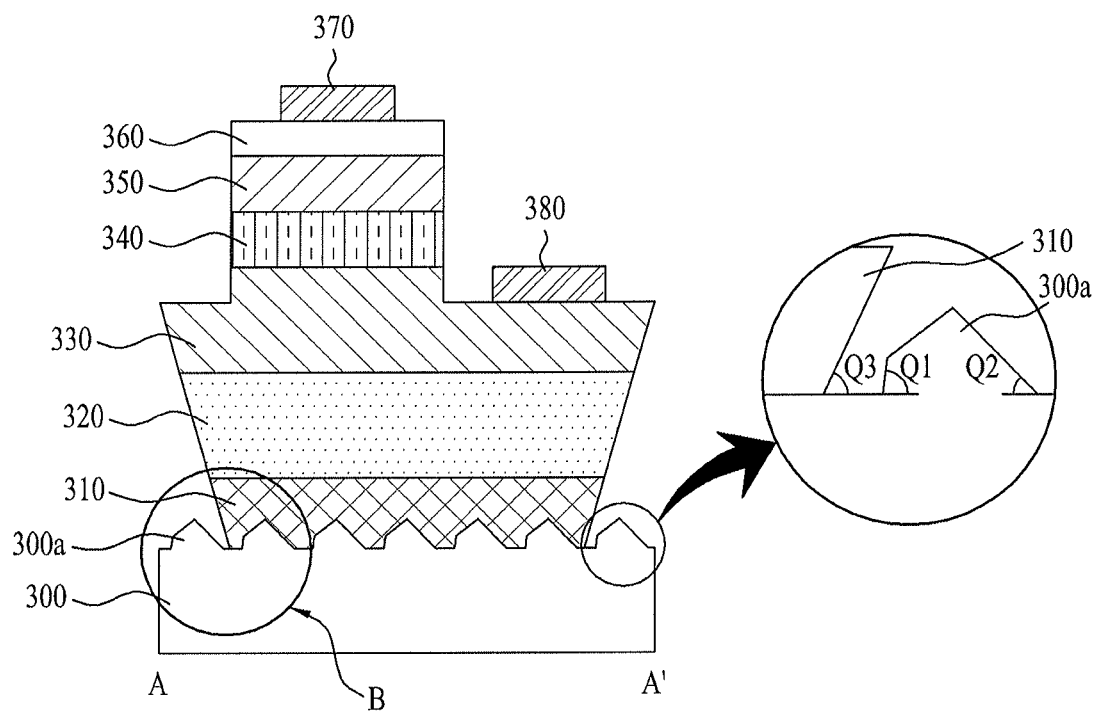
FIG. 9 is a cross-sectional view taken along a line A-A' in FIG. 8.
Figure 10:
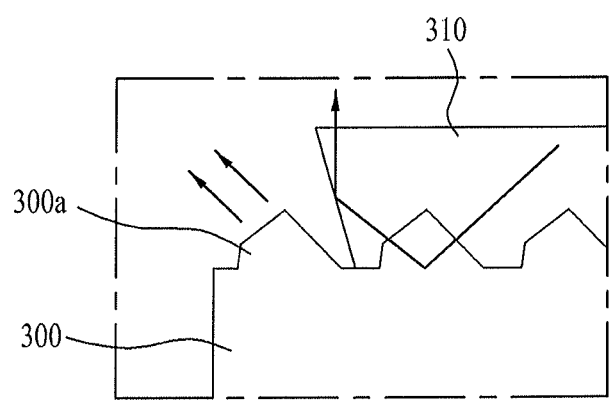
FIG. 10 is a sectional view illustrating reflection of light from a region B of FIG. 9.

FIG. 8 is a perspective view illustrating an LED according to a second embodiment of the present invention. FIG. 9 is a cross-sectional view taken along a line A-A' in FIG. 8. FIG. 10 is a sectional view illustrating reflection of light from a region B of FIG. 9.

In the second embodiment of the present invention, the first buffer layer, second buffer layer and first conductive layer of the LED according to the first embodiment are laterally etched in order to enable light, which may vanish within the device, to be laterally extracted, and thus to achieve an enhancement in the luminous efficacy of the LED.

As shown in FIGS. 8 and 9, the LED according to the second embodiment of the present invention, which may be a nitride semiconductor LED, includes a substrate 300 provided, at a surface thereof, with protrusions 300a, a first buffer layer 310, a second buffer layer 320 and a first semiconductor layer 330, which are sequentially formed over an entire upper surface of the substrate 300 while having inclined surfaces at side surfaces thereof, respectively, an active layer 340 formed on a portion of the first semiconductor layer 330, and a second semiconductor layer 350 formed over the active layer 340. The LED also includes an ohmic contact layer 360 formed over the second semiconductor layer 350, a first electrode pad 380 formed on a portion of the first semiconductor layer 330, except for the portion where the active layer 340 is formed, and a second electrode pad 370 formed over the ohmic contact layer 360.

Each protrusion 300a has a side surface inclined from the surface of the substrate 300 at an acute angle, namely, a first angle θ1, and another side surface inclined from the surface of the substrate 300 at an acute angle different from the first angle θ1, namely, a second angle θ2. The surfaces of the protrusion 300a respectively inclined at the first and second angles θ1 and θ2 with respect to the surface of the substrate 300 are side surfaces most adjacent to the substrate 300. The first and second angles θ1 and θ2 range from 45° to 90°. Also, the first angle θ1 is greater than the second angle θ2.

In the LED according to the second embodiment of the present invention, each of the first buffer layer 310, second buffer layer 320, and first semiconductor layer 330 sequentially formed over the substrate 300 has a polygonal structure having a polygonal cross-section with an upwardly-increasing area while having inclined surfaces at side surfaces thereof. The angle formed by each side surface of each of the first buffer layer 310, second buffer layer 320, and first semiconductor layer 330 with respect to the substrate 300, namely, a third angle θ3, may be about 10 to about 90°.

As shown in FIG. 10, light incident upon the first buffer layer 310 after being generated in the active layer 340 (FIG. 9) may be outwardly emitted after being reflected by the inclined surfaces at a reflection angle less than a critical angle. Although only the first buffer layer 310 is shown in FIG. 10, light incident upon the second buffer layer 320 (FIG. 9) and first semiconductor layer 330 (FIG. 9) sequentially formed over the first buffer layer 310 may also be outwardly emitted after being reflected by the inclined surfaces of the second buffer layer 320 and first semiconductor layer 330.

Thus, although light is incident upon the first buffer layer 310, second buffer layer 320, and first semiconductor layer 330, an enhancement in the luminous efficacy of the LED according to the illustrated embodiment of the present invention is achieved because the light is outwardly emitted after being varied in direction by the inclined surfaces of the first buffer layer 310, second buffer layer 320, and first semiconductor layer 330.

In particular, since the first buffer layer 310, second buffer layer 320, and first semiconductor layer 330 have the inclined surfaces, a part of the protrusions 300a formed on the substrate 300 may be exposed. Accordingly, light emitted through the inclined surfaces may be reflected by the exposed protrusions 300a, so that a further enhancement in luminous efficacy may be achieved. Although not shown, the side surfaces of the substrate 300 may also be etched to be inclined.

Figures 11, 12:
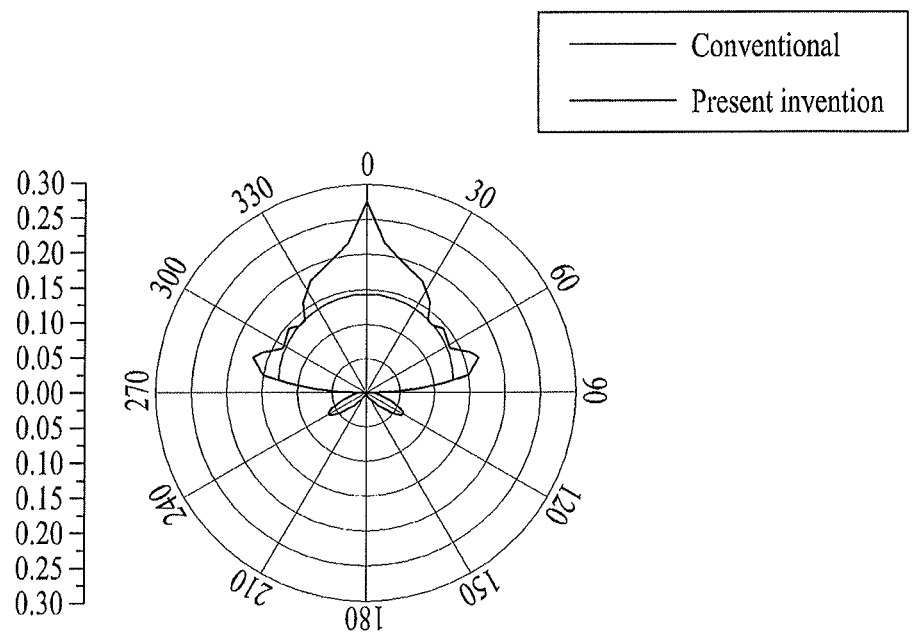
FIG. 11 is a diagram depicting orientation angle distributions of a buffer layer in a conventional LED and the buffer layer in the LED according to the present invention.
FIG. 12 is a table showing light efficiencies of the conventional LED and the LED according to the present invention.

FIG. 11 illustrates a diagram depicting orientation angle distributions of a buffer layer in a conventional LED and the buffer layer in the LED according to the second embodiment of the present invention. FIG. 12 is a table showing light efficiencies of the conventional LED and the LED according to the second embodiment of the present invention exhibited assuming that light of 1 W is emitted from an active layer.

In FIG. 11, the orientation angle distribution of the buffer layer in the conventional LED is depicted by a dotted line, whereas the orientation angle distribution of the buffer layer in the LED according to the second embodiment of the present invention is depicted by a solid line. In the conventional LED, it is difficult to vary the angle of light because the orientation angles of the buffer layer are distributed in the form of a semicircular shape, as shown in FIG. 11. On the other hand, in the LED according to the second embodiment of the present invention, the angle of light may be easily varied because the orientation angles of the buffer layer are irregularly distributed in that the side surfaces of the buffer layer are inclined.

Thus, in the LED according to the second embodiment of the present invention, even the light incident upon the buffer layer may be easily outwardly emitted. Similarly to the buffer layer, it may also be possible to easily vary the angle of light in the first semiconductor layer because the side surfaces of the first semiconductor layer are inclined. As shown in FIG. 12, the LED according to the second embodiment of the present invention exhibits an increase in luminous efficacy of about 3% and an increase in light output of about 69%, as compared to the conventional LED, assuming that light of 1 W is emitted from the active layer.

Hereinafter, a method for fabricating the LED according to the second embodiment of the present invention will be described in detail with reference to the accompanying drawings.

Figure 13:
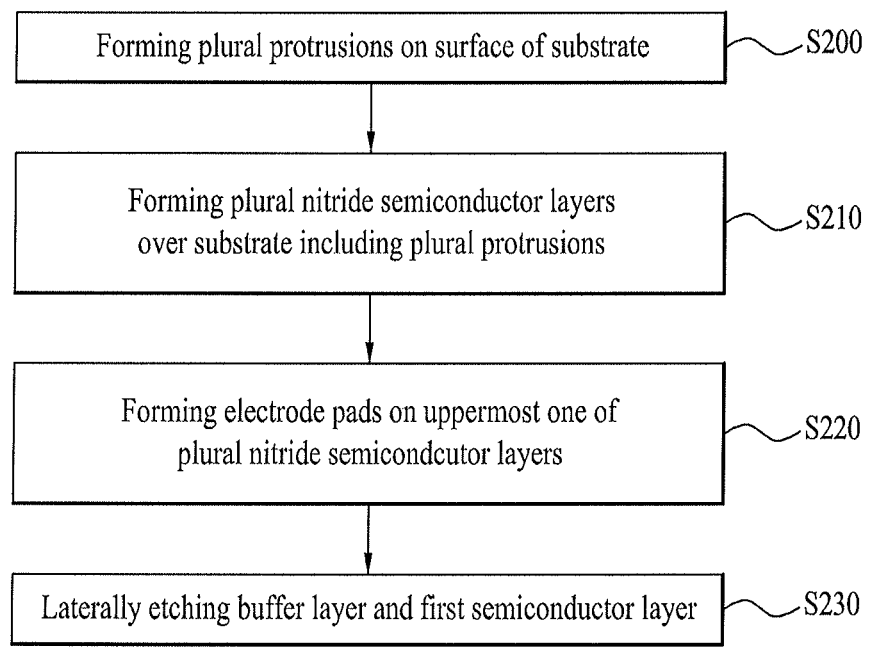
FIG. 13 is a flowchart illustrating a method for fabricating the LED according to the second embodiment of the present invention.
Figure 14A:
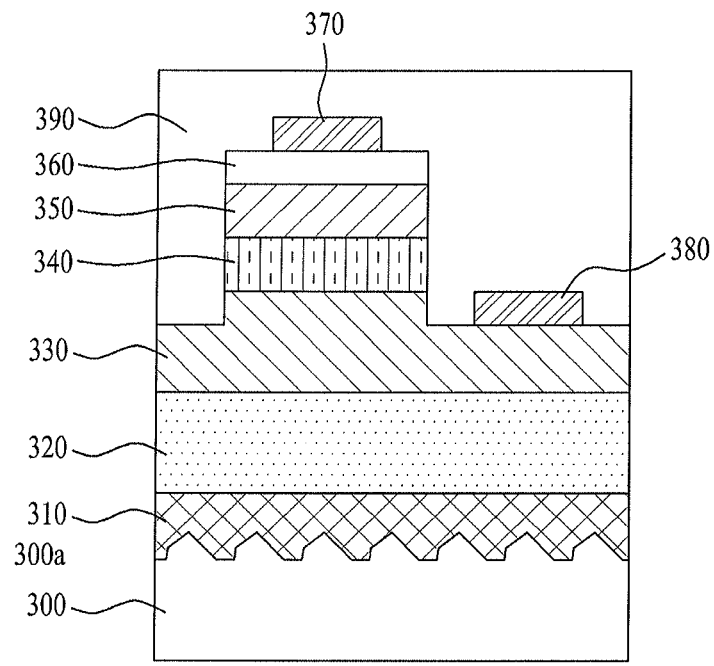
FIGS. 14A and 14B are sectional views illustrating sequential processes of the LED fabrication method shown in FIG. 13, respectively.
Figure 14B:
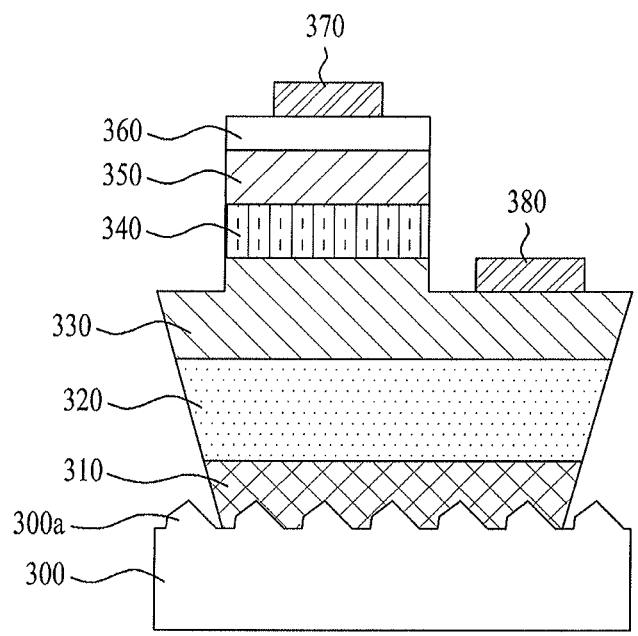

FIG. 13 is a flowchart illustrating a method for fabricating the LED according to the second embodiment of the present invention. FIGS. 14A and 14B are sectional views illustrating sequential processes of the LED fabrication method shown in FIG. 13, respectively.

As shown in FIG. 13, the method for fabricating the LED according to the second embodiment of the present invention includes a process of forming a plurality of protrusions on a surface of the substrate (S200), a process of forming a plurality of nitride semiconductor layers over the protrusion-formed surface of the substrate (S210), a process of forming electrode pads on an uppermost one of the nitride semiconductor layers (S220), and a process of laterally etching a part of the nitride semiconductor layers, namely, a buffer layer and a first semiconductor layer.

The process S200 of forming a plurality of protrusions on the surface of the substrate, the process S210 of forming a plurality of nitride semiconductor layers over the protrusion-formed surface of the substrate, and the process S220 of forming electrode pads on an uppermost one of the nitride semiconductor layers are identical to those of the method for fabricating the LED according to the first embodiment of the present invention and, as such, no description thereof will be given.

The process S230 of laterally etching the buffer layer and first semiconductor layer includes forming a passivation film, laterally etching the buffer layer and first semiconductor layer, and removing the passivation film.

The process of etching the buffer layer and first semiconductor layer is carried out using a combination of an inductively coupled plasma (ICP) method and a reactive ion etching (RIE) method, namely, an RIE-ICP method. Meanwhile, the LED may be damaged by etching gas. To this end, a passivation film is formed over the entire surface of the LED, using $SiO_2$, as shown in FIG. 14A.

The passivation film 390 is formed to a thickness of 1,000 to 3,000 Å, using a plasma enhanced chemical vapor deposition (PECVD) method. Thereafter, a mask (not shown) is formed on the passivation film 390 through deposition of one or more of Ni, Cr, Al, Au, and Ti, and the resulting structure is then subjected to an RIE-ICP method.

In accordance with the RIE-ICP method, the side surfaces of the buffer layers 310 and 320 and first semiconductor layer 330 may be not only isotropically etched, but also vertically etched, so that they may have inclined surfaces. When the electric power for RIE to isotropically etch the side surfaces is higher than the electric power for ICP to vertically etch the side surfaces, the side surfaces are etched to be inclined, so that a part of the protrusions 300a of the substrate 300 are exposed. Subsequently, the passivation film 390 (FIG. 14A) and the mask (not shown) are removed.

It may be possible to adjust the angles of the side surfaces of the buffer layers 310 and 320 and first semiconductor layers 320 with respect to the substrate 300 by adjusting the ICP power to vertically etch the side surfaces and the RIE power to isotropically etch the side surfaces.

As is apparent from the above description, in the LED according to each embodiment of the present invention, it may be possible to achieve an enhancement in light extraction efficiency because protrusions are formed on the surface of the substrate, and each of the protrusions has side surfaces inclined from the surface of the substrate at different angles so that light emitted through the protrusion is condensed toward one side. Also, the buffer layers and first semiconductor layers have inclined surface at the side surfaces thereof, so that light incident upon the buffer layers and first semiconductor layer is outwardly emitted after being reflected at a reflection angle less than a critical angle. Accordingly, an enhancement in the luminous efficacy of the LED is achieved.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

The invention claimed is:

1. A method for fabricating a light emitting diode, comprising:
    etching a surface of a substrate, to form a plurality of protrusions;
    etching the protrusions such that each of the protrusions has a side surface inclined from the surface of the substrate at a first angle, and another side surface inclined from the surface of the substrate at a second angle different from the first angle;
    forming a plurality of nitride semiconductor layers over the protrusion-formed substrate; and
    forming electrode pads on at least one of the plural nitride semiconductor layers.

2. The method according to claim 1, wherein the etching the protrusions uses a dry etching method using a mask.

3. The method according to claim 2, wherein the dry etching method uses an etching gas containing Cl, which is selected from the group consisting of Cl2, BCl3, HCl, CCl4 and SiCl4, or an HBr etching gas.

4. The method according to claim 2, wherein the mask has an open region at a central portion thereof, and an inclined surface formed between the central portion and a peripheral portion surrounding the central portion.

5. The method according to claim 1, wherein the forming the plurality of nitride semiconductor layers comprises:
    forming a buffer layer over the entirety of the protrusion-formed surface of the substrate;
    forming a first semiconductor layer over the buffer layer;
    forming an active layer having a multi-quantum well structure on the first semiconductor layer; and
    forming a second semiconductor layer over the active layer.

6. The method according to claim 5, wherein the forming the electrode pads comprises:
    forming an ohmic contact layer on the second semiconductor layer;
    removing a portion of the second semiconductor layer and a portion of the active layer, to expose a portion of the first semiconductor layer;
    forming a first electrode pad on the exposed portion of the first semiconductor layer; and
    forming a second electrode pad to contact a portion of the ohmic contact layer.

7. The method according to claim 1, further comprising:
    inclinedly etching side surfaces of the plural nitride semiconductor layers such that each of the nitride semiconductor layers has an upwardly-increasing area.

8. The method according to claim 7, wherein the inclinedly etching uses a combination of an inductively coupled plasma (ICP) method and a reactive ion etching (RIE) method, and electric power supplied to carry out the RIE method is higher than electric power supplied to carry out the ICP method.

9. The method according to claim 7, wherein the inclinedly etching further comprises forming a passivation film to cover surfaces of the plural nitride semiconductor layers and surfaces of the electrode pads.

10. The method according to claim 1, wherein the etching the protrusions is carried out such that each of the protrusions has a cross-section having a curvature or a polygonal shape.

11. The method according to claim 1, wherein the etching the protrusions is carried out such that the side surfaces of each protrusion are side surfaces of the protrusion most adjacent to the substrate, and the first and second angles range from about 45° to about 90°.

12. The method according to claim 11, wherein the etching the protrusions is carried out such that the first angle is greater than the second angle.

* * * * *